(12) United States Patent
Liang

(10) Patent No.: US 6,845,556 B1
(45) Date of Patent: Jan. 25, 2005

(54) TECHNIQUES FOR REWORKING CIRCUIT BOARDS WITH NI/AU FINISH

(75) Inventor: Jin Liang, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 165 days.

(21) Appl. No.: 10/102,460

(22) Filed: Mar. 20, 2002

(51) Int. Cl.[7] .............................................. H05K 3/34
(52) U.S. Cl. ........................ 29/840; 29/764; 29/827; 29/839; 29/890.128; 228/180.1; 228/191; 257/666; 439/876
(58) Field of Search ........................ 29/840, 764, 827, 29/839, 890.128; 228/180.1, 191; 257/666; 439/876

(56) References Cited

U.S. PATENT DOCUMENTS

| | | | | |
|---|---|---|---|---|
| 3,903,581 A | * | 9/1975 | Michel | ........................ 29/831 |
| 4,444,559 A | * | 4/1984 | Schink et al. | ................ 432/226 |
| 5,152,056 A | * | 10/1992 | Shook | ........................ 29/840 |
| 6,257,478 B1 | * | 7/2001 | Straub | ........................ 228/6.2 |

OTHER PUBLICATIONS http://www.dremel.com/productdisplay/tool_template.asp?SKU=395&Color=99CCFF; #395 Variable-Speed MultiPro® Tool; Copyright 2000; 2 Pages.

* cited by examiner

Primary Examiner—Carl J. Arbes
Assistant Examiner—Tim Phan
(74) Attorney, Agent, or Firm—Chapin & Huang, L.L.C.; David E. Huang, Esq.

(57) ABSTRACT

Circuit board reworking techniques involve removing original solder from the metallic pad, removing an outer portion of the metallic pad to expose an inner portion of the metallic pad, and applying new solder to the metallic pad. Removal of the original solder and the outer portion of the metallic pad exposes the inner portion which has non-corroded and non-contaminated metal. The application of new solder to this inner portion of the pad enables wettability of the pad as well as provides a protective coating to prevent corrosion of the inner portion (e.g., oxidation, reaction with contaminants, etc.). Accordingly, circuit board abnormalities such as "Black Pad" defects can be cured.

13 Claims, 10 Drawing Sheets

TECHNIQUES FOR REWORKING CIRCUIT BOARDS WITH NI/AU FINISH

BACKGROUND OF THE INVENTION

A typical printed circuit assembly (PCA) includes a section of circuit board material (i.e., layers of conductive and non-conductive material sandwiched together) and one or more components attached thereto. Examples of circuit board components include integrated circuits (ICs), resistors, capacitors, connectors and pins. Some circuit board components such as Ball Grid Array (BGA) devices, Chip-Scale Packaging (CSP) devices, Flip Chip devices and Multi-chip modules (MCMs) solder to metallic pads of circuit boards using Surface Mount Technology (SMT).

A typical metallic pad on the section of circuit board material includes a layer of copper, a layer of nickel and a coating of gold. Such a pad is typically formed using an electroless Nickel immersion gold surface finish process. The layer of copper is essentially an extension of the metallic etch (i.e., a trace) that runs between different locations of the section of circuit board material (e.g., to connect multiple devices together). The layer of nickel provides a durable mounting surface which has a high affinity for solder in order to form a solder joint with a corresponding contact of a circuit board component (e.g., during a circuit board manufacturing process such as reflow soldering). The coating of gold protects the layer of nickel against oxidation and from reacting with undesired contaminants.

After the circuit board components have been mounted to the section of circuit board material, the circuit board typically goes through a variety of tests (e.g., burn-in, vibration testing, extreme temperature testing, etc.). Occasionally, a circuit board may fail a test due to a defect in an electrical connection between a component and the section of circuit board material. One such defect is called a "Black Pad". Such a defect can present itself as a pressure sensitive circuit board component having an intermittent electrical connection with the section of circuit board material (e.g., an intermittent connection between a metallic pad and a ball contact of a BGA device). Applying pressure to the circuit board component (e.g., pressing gently the BGA device toward the section of circuit board material) typically removes the intermittency and forms a solid and reliable electrical connection. However, once the pressure is removed from the component, the intermittency returns (i.e., the electrical connection between the metallic pad and the contact is again prone to intermittent failure).

One conventional approach to handling a "Black Pad" defect in a circuit board is simply to discard the circuit board. For example, in response to a failing circuit board in the field, a technician replaces the failing circuit board with a new circuit board. Later, if the failing circuit board is determined to have one or more "Black Pad" defects, the failing circuit board is thrown away.

A second conventional approach to handling a "Black Pad" defect within a circuit board is to simply (i) remove the circuit board component in order to expose the component mounting location having the "Black Pad" defect, (ii) melt and suck away solder from the component mounting location, and (iii) solder a new circuit board component to the component mounting location by using a conventional flux. For example, a technician lowers a nozzle, which is capable of applying heated gas, over the circuit board component in order to melt the solder joints and remove the component from the section of circuit board material. The technician then removes any excess of the original solder from the component mounting location. Next, the technician prints solder paste (e.g., a combination of solder and flux) over the component mounting location. Finally, the technician solders a new circuit board component to the component mounting location using the nozzle.

SUMMARY OF THE INVENTION

Unfortunately, there are deficiencies to the above-described conventional approaches to handling circuit boards with "Black Pad" defects. For example, in the above-described conventional approach of simply throwing away circuit boards having "Black Pad" defects, a significant amount of added value is lost. In particular, some circuit boards may cost several thousands of dollars to make and it may be a significant drawback for a company to bear the burden of regularly writing-off such a cost.

Additionally, the above-described second conventional approach, which involves simply removing a component and excess solder from the section of circuit board material and soldering on a new component, does not consistently and effectively repair the intermittent connections resulting from "Black Pad" defects. Rather, these intermittent connections are often formed by flaws in the intermetallic boundaries of the nickel layers of the metallic pads, and such flaws are not fixed by simply replacing components. To the contrary, a metallic pad suffering from a "Black Pad" defect typically has low solder-wetting ability (i.e., low affinity for solder) which does not improve when a contact of the new component is soldered to the pad. Accordingly, any new solder joint formed on the metallic pad is likely to be unreliable. In some situations, even if the metallic pad suffering from the "Black Pad" defect has not significantly lost its solder wetting ability, it is likely that (i) substantial nickel corrosion exists below the top surface of the metallic pad (e.g., 20 micro-inches beneath the surface) and (ii) the corrosion will remain after soldering the new component. Thus, as long as the "Black Pad" defect remains, the circuit board will have an electrical connection which is prone to intermittent failure.

The invention is directed to techniques for reworking a circuit board having a "Black Pad" defect. The techniques involve removing an outer portion of the metallic pad to expose an inner portion of the metallic pad. These techniques are well-suited for curing "Black Pad" defects since corrosion (e.g., oxidized metal and metal reacted with other contaminants) in the outer portion of the metallic pad have been identified as significant causes of poor wettability in metallic pads suffering from "Black Pad" defects. Accordingly, removal of the outer portion of such a metallic pad exposes a healthy and reliable inner portion of the pad which is well-suited for establishing a new healthy electrical connection with a contact of a circuit board component.

One embodiment of the invention is directed to a method which includes the steps of removing original solder from the metallic pad, removing an outer portion of the metallic pad to expose an inner portion of the metallic pad, and applying new solder to the metallic pad. Removal of the original solder and the outer portion of the metallic pad exposes the inner portion which has non-corroded and non-contaminated metal. The application of new solder to this inner portion of the pad enables wettability of the pad as well as provides a protective coating to prevent corrosion of the inner portion (e.g., oxidation, reaction with contaminants, etc.).

In one arrangement, the metallic pad includes a layer of nickel (e.g., a nickel layer which is approximately 200 to 250 micro-inches in thickness). In this arrangement, the step of removing the outer layer of the metallic pad includes the step of taking off a section of the layer of nickel which is substantially in the range of 20 to 50 micro-inches in thickness. Accordingly, corrosion and reacted/contaminated parts of the nickel layer are removed so that fresh or virgin nickel is now available for forming a new solder joint.

In one arrangement, a tool has a tip which is capable of rotating. In this arrangement, the step of taking off the section of the layer of nickel includes the steps of (i) positioning the circuit board onto a workstation base, and (ii) applying the tip of the tool to the layer of nickel while the circuit board is disposed on the workstation base and while the tip of the tool rotates. Accordingly, the rotating tip can polish off (i.e., rub off, scrape off, shear off, etc.) the outer portion of nickel to expose fresh nickel.

In one arrangement, the tip of the tool includes fiber-reinforced polyester material. In this arrangement, the step of applying the tip to the nickel layer includes the step of contacting the nickel layer with the fiber-reinforced polyester material of the tip with an amount of force substantially in the range of 0.05 to 0.10 pounds of force. Accordingly, if the weight of the tool provides this amount, a technician operating the tool in a handheld manner can essentially guide the tool over the pad and allow the weight of the tool to provide the proper amount of force on the pad.

In one arrangement, the technician contacts the layer of nickel with the tip of the tool for an amount of time substantially in the range of 8 to 12 seconds while the tip of the tool rotates at a rate substantially in the range of 1400 to 2400 rotations per minute. In one arrangement, the tip of the tool has a pencil-point shaped end, and the technician orients the pencil-point shaped end of the tip to the layer of nickel at an angle which is substantially in the range of 55 to 65 degrees. In one arrangement, the technician (i) observes a top surface of the metallic pad through a microscope, (ii) positions the tip over the metallic pad such that, when an end of the tip of the tool resides substantially over a center point of the top surface of the metallic pad, at least 75% of the top surface of the metallic pad is visible through the microscope, and (iii) while continuing to observe the metallic pad through the microscope, moves the tip of the tool over the metallic pad with an orbital motion stroke to take off the section of the layer of nickel. Through experimentation such arrangements have been found to be well-suited for removing the outer portion of the metallic pad in order to expose the inner portion of the metallic pad.

In one arrangement, the method further includes, prior to the step of taking off the section of the layer of nickel, the step of disposing the tip of the tool against silicone carbide material in order to dress the tip of the tool for removal of the section of the layer of nickel. For example, a technician can draw the tip along a silicone carbide surface (e.g., silicon carbide paper) having a fine grit value of substantially 400 grit. The tip is now well-dressed for removing the outer layer of the metallic pad.

In one arrangement, the technician, prior to the step of removing the original solder from the metallic pad, draws the tip of the tool along a silicone carbide surface having a coarse grit value of substantially 160 grit (e.g., coarse grit silicon carbide paper) in order to dress the rotating the tip of the tool for removal of the original solder from the metallic pad. Such a step provides the tip with a porosity, surface finish and texture which is well-suited for removing the original solder from the metallic pad.

In one arrangement, the technician distributes carbohydroxilate flux over the metallic pad prior to removing the original solder and, again, prior to removing the outer portion of the metallic pad. The carbohydroxilate flux prevents the pad and/or the rotating tip from overheating (e.g., burning due to friction), provides a suitable amount of abrasion, and facilitates containment of debris resulting from the removal process.

In one arrangement, the method further includes the step of removing an excess of the new solder from the metallic pad, applying flux remover to the metallic pad, wiping the metallic pad with a lint-free cloth, and washing the circuit board in a detergent bath. Such steps result in a well-repaired metallic pad which is suitable for forming a reliable solder joint with a new circuit board component (e.g., a BGA component).

The features of the invention, as described above, may be employed in electronic equipment systems, devices and methods as well as computer-related manufacturing apparatus and components such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for reworking a circuit board having a metallic pad. The techniques involve removing an outer portion of the metallic pad to expose an inner portion of the metallic pad. These techniques are well-suited for curing "Black Pad" defects since corrosion (e.g., oxidized metal and metal reacted with other contaminants) in the outer portion of the metallic pad have been identified as significant causes of poor electrical connectivity in metallic pads suffering from "Black Pad" defects. Accordingly, removal of the outer portion of such a metallic pad exposes a healthy and reliable inner portion of the pad (i.e., fresh and uncontaminated metal) which is well-suited for establishing a new healthy electrical connection with a contact of a circuit board component.

Figure 1:
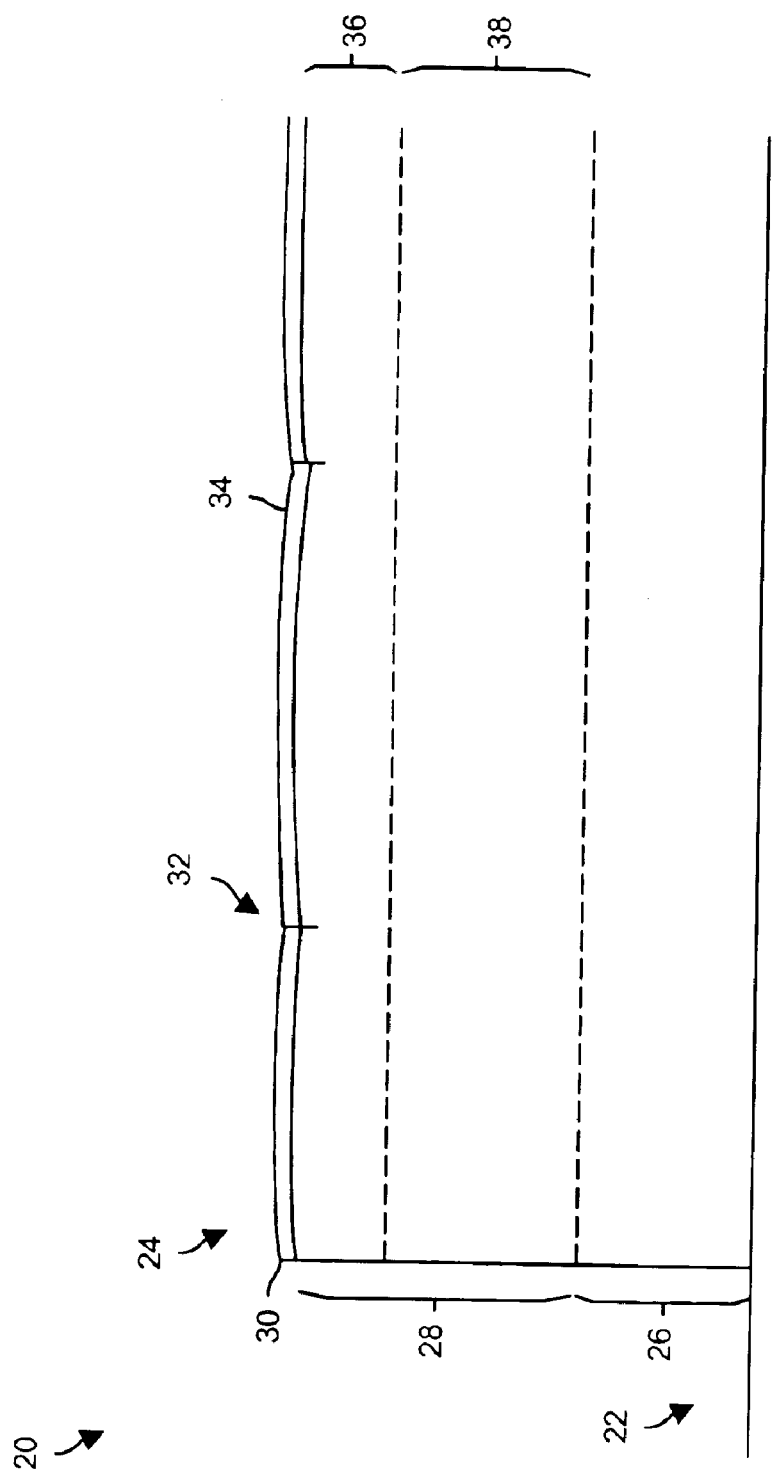
FIG. 1 is a cross-sectional view of a portion of an Ni/Au circuit board having a "Black Pad" defect.

FIG. 1 shows a cross-sectional view of a portion of a circuit board 20 having a section of circuit board material 22 (e.g., conductive and non-conductive layers of material sandwiched together) and a metallic pad 24. By way of example only, the metallic pad 24 includes a layer 26 of copper, a layer 28 of nickel, and a top coating 30 of gold. The gold coating 30 protects the underlying metal layers 26, 28 from corrosion and other types of damage (e.g., oxidation, reaction with contaminants, etc.). The nickel layer 28 provides a durable structure which has high wettability characteristics for forming a solder joint with a contact of a circuit board component. The copper layer 26 (e.g., standard metallic etch of the circuit board 20) is supported by the section of circuit board material 22 and extends from the metallic pad 24 to other locations of the circuit board section 22 (e.g., to another component, to a ground or power plane through a plated-through hole, etc.). In one arrangement, the pad 24 of the circuit board 20 is formed using electroless nickel immersion gold finish.

Superficially, the solder joints associated with "Black Pad" defects may appear normal although these joints are actually more brittle and weaker than normal solder joints. However, upon close inspection and analysis of "Black Pad" defects (i.e., examination after component removal and site cleaning), it had been discovered that "Black Pad" defects are often caused by extensive corrosion of parts of the nickel layer 28. Such corrosion can be due to simple oxidation of parts of the nickel layer 28, reaction with contaminants (e.g., surface residues, moisture, ionic debris, contaminated flux, other metals, etc.), or an imbalance of impurities mixed with the nickel of the nickel layer 28 (e.g., phosphorus, organic or inorganic compounds, chelators, stabilizers, etc.). Moreover, the use of particular chemicals such as phosphorus and organic and inorganic compounds when creating the metallic pad 24 (e.g., an unbalanced nickel bath chemistry during the electroless nickel immersion gold plating process) can result in increased brittleness and interfacial fractures 32 at or near the top surface 34 of the pad 24. Accordingly, "Black Pad" defects can cause brittle fractures by physical stresses placed on the metallic pad 24 (e.g., dropping or rough handling of the circuit board 20, or even nominal amounts of stress, causing interfacial fractures between the intermetallic and the nickel layer 28), and such defects tend to be more commonly found in high stress areas of component mounting locations (e.g., along outside rows of interconnects, in corners, etc.).

The invention enables removal a portion of the metallic pad 24. As a result, parts of the metallic pad 24 which include corrosion and/or contamination can be removed to expose fresh undamaged metal for use in forming a new electrical connection (e.g., a solder joint) with a circuit board component. Accordingly, the "Black Pad" defect is effectively removed from the circuit board 20, and the circuit board 20 can be repaired and reused. Thus, the deficiencies of the earlier-described conventional approaches to handling "Black Pad" defects such as throwing away circuit boards (e.g., wasted added value) and removing and re-soldering components without fixing the "Black Pad" defects (e.g., not completely removing electrical connection intermittency, etc.) are overcome by the invention.

By way of example only, suppose that the nickel layer 28 is substantially 200 to 250 micro-inches in thickness. Further suppose that the gold coating 30 of the metallic pad 24 is substantially 6 micro-inches in thickness. Now, further suppose that a "Black Pad" defect resides in the metallic pad 24. In particular, suppose that there exists corrosion underneath the gold coating 30, and that the corrosion extends roughly 10 micro-inches below a top surface 34 of the pad 24 (analysis has revealed that such corrosion typically resides within the top 20 to 50 micro-inches of the pad 24).

In accordance with the invention, an outer portion 36 of the nickel layer 28, which is nearest the top surface 34 of the pad 24 and which is substantially 20 to 50 micro-inches in thickness (i.e., the top 10 to 20 percent of the nickel layer 28), is removed to expose an inner portion 38 of the nickel layer 28. This inner portion 28 includes fresh, uncontaminated nickel (i.e., virgin nickel) which is well-suited for forming a new solder joint. In particular, the inner portion 28 has high durability and high wettability characteristics. Further details of the invention will now be provided with reference to FIG. 2.

Figure 2:
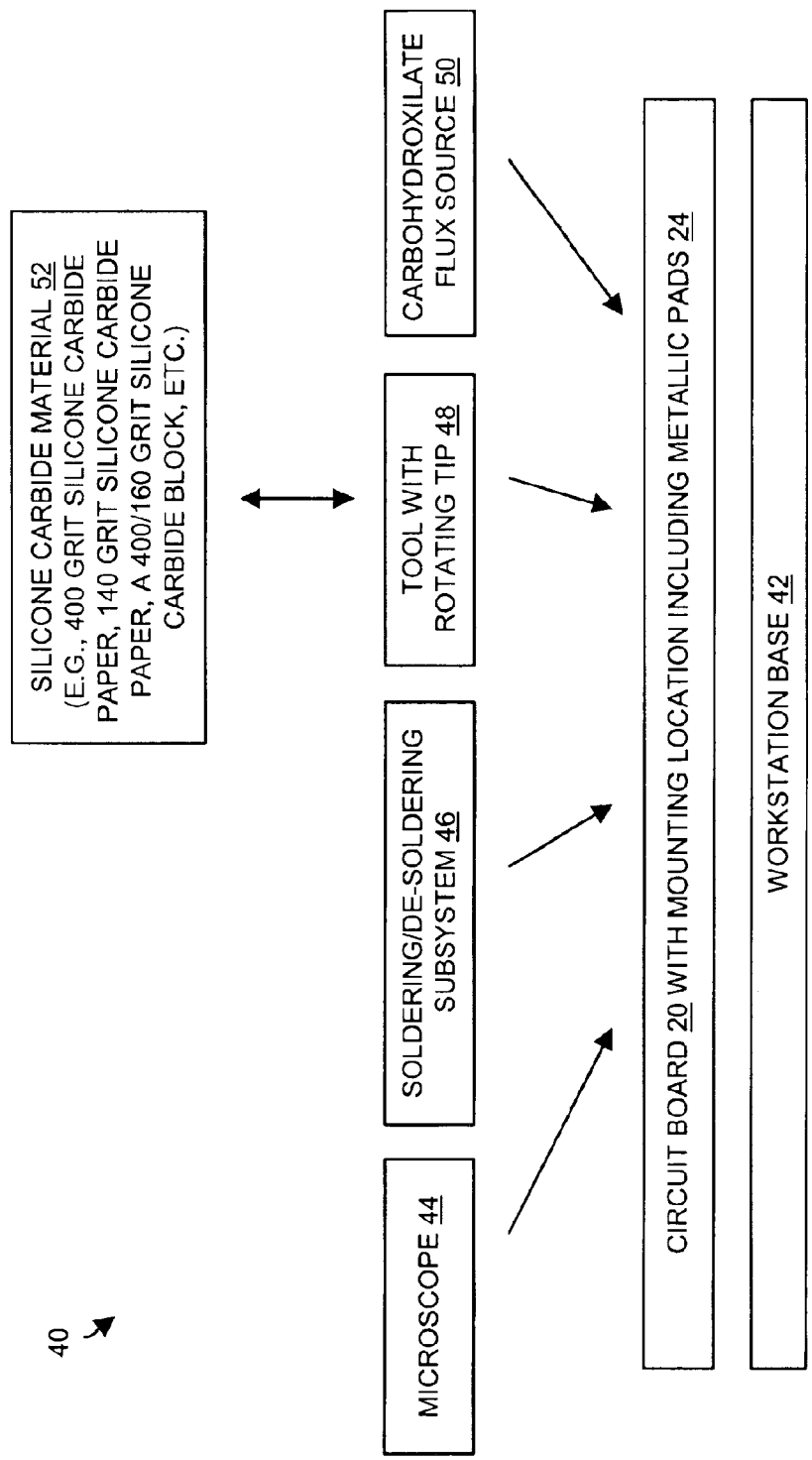
FIG. 2 is a block diagram of a workstation for reworking the circuit board of FIG. 1.

FIG. 2 shows a block diagram of a workstation 40 for reworking the circuit board 20 of FIG. 1. The workstation 40 includes a workstation base 42, a microscope 44, a soldering/de-soldering subsystem 46, a tool with a rotating micro-abrasive tip 48, a carbohydroxilate flux source 50, and a source of silicone carbide material 52. As shown by the arrows in FIG. 2, the workstation base 42, the microscope 44, the soldering/de-soldering subsystem 46, the tool with the rotating tip 48 and the carbohydroxilate flux source 50 are directly involved with reworking the circuit board 20. On the other hand, the silicone carbide material 52 is only indirectly involved. In particular, the silicone carbide material 52 is used to dress the rotating tip of the tool 48 for various metal removal operations.

A technician operates the above-listed various elements of the workstation 40 to rework circuit boards 20. For example, the technician may receive a circuit board 20 having a circuit board component which exhibits "Black Pad" defect symptoms (e.g., a circuit board 20 having a component which works fine when pressure is applied, but that suffers from an intermittent electrical connection when the pressure is removed). The technician initially operates the soldering/de-soldering subsystem 46 to remove the problematic circuit board component (e.g., the technician can lower a nozzle of the subsystem 46 over the component to apply heat in order to melt the solder joints which hold the component to the section of circuit board material). The component mounting location of the circuit board section is now exposed. Next, the technician cleans the component mounting location (e.g., the technician sucks away excesses of the original solder from the original solder joints).

At this point, the technician closely inspects each metallic pad 24 of the component mounting location using the microscope 44 (e.g., a stereo microscope). Metallic pads 24 suffering from "Black Pad" defects may exhibit signs of non-wetting or de-wetting (i.e., flux alone is unable to remove the defective nickel surface). Additionally, in contrast to non-defective pads 24 which are typically coated with solder, metallic pads 24 suffering from "Black Pad" defects may appear darker, e.g., matte light gray or even black. Alternatively, depending on the severity of the corrosion (e.g., oxidation), the metallic pads 24 suffering from "Black Pad" defects may appear tan to brown and have a granular surface.

On occasion, metallic pads 24 suffering from "Black Pad" defects may be difficult to identify by color. However, the technician can inspect the pads 24 through the microscope 44 and draw a standard pick across the surface 34 (also see FIG. 1) of normal-looking pads 24. If the pick boroughs a line into a pad 24, then the surface of that pad 24 is likely soft and is solder, i.e., is non-defective. In contrast, if the pick does not borough a line into the pad 24 (i.e., if the pad 24 is hard and unyielding), then the surface of the pad 24 is likely non-wetted or de-wetted nickel (i.e., a "Black Pad") and the pad 24 is in need of repair. When the technician detects a circuit board 20 having a "Black Pad" defect, the technician can repair the defect at the workstation 40 or, if the workstation 40 is dedicated to simply identifying circuit board defects, (i) label the circuit board 20 as having an interfacial fracture and (ii) send that circuit board 20 to another workstation 40 for repair.

In order to repair a metallic pad 24 of a circuit board 20 having a "Black Pad" defect, the technician removes the outer portion 36 of the nickel layer 28 to expose the inner portion 38 of the nickel layer 28 using the tool 48. In particular, the technician adds carbohydroxilate flux from the carbohydroxilate flux source 50 over the pad 24. The technician then dresses the tip of the tool 48 by drawing the tip along the silicone carbide material 52. The technician then applies the tip of the tool 48 to the metallic pad 24 such that fiber-reinforced polyester material of the tip micro-polishes away parts of the pad 24. In some situations, the technician removes any remnant of original solder that is left on the top surface 34 of the pad 24 prior to removing the outer portion 36 of the nickel layer 28. In other situations, the technician had previously removed all of the original solder during removal of the circuit board component, and none of the original solder remains due to non-wetting or de-wetting of the pad 24. In one arrangement, the technician draws the tip along silicone carbide material of different grit values depending on whether the technician is about to remove solder or nickel from the metallic pad 24. Further details of how the technician prepares and operates the tool 48 will be described later.

Figure 3:
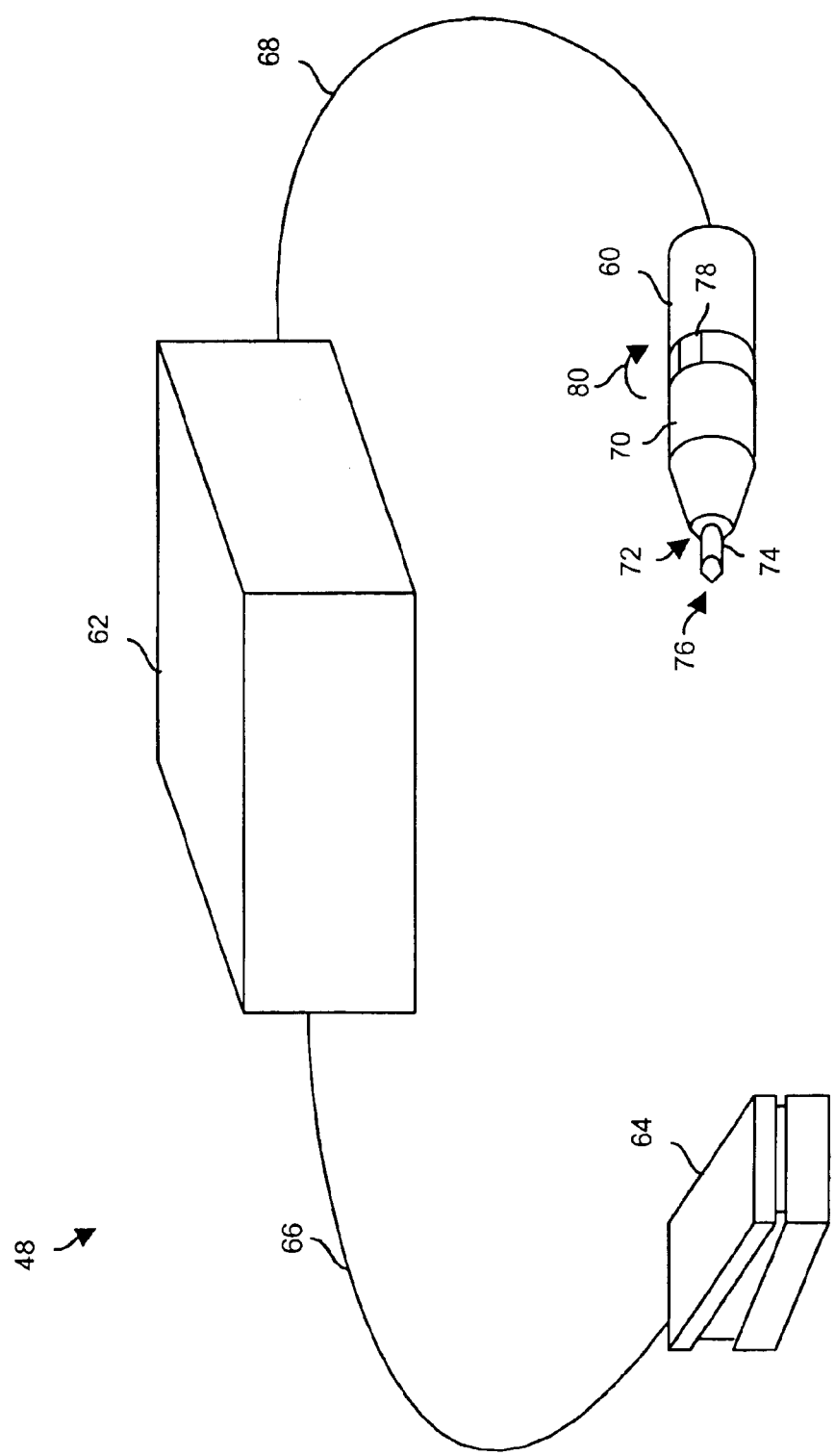
FIG. 3 is a perspective view of a tool of the workstation of FIG. 2, the tool being configured to rotate a tip.

FIG. 3 shows a perspective view of the tool 48 having the rotating tip. The tool 48 includes a handle portion 60, a controller 62, and switch 64. The tool further includes a first cable 66 which connects the handle portion 60 to the controller 62, and a second cable 68 which connects the switch 64 to the controller 62. In one arrangement, the handle portion 60 is ergonomically configured to be operated by a technician in a handheld manner. In one arrangement, the controller 62 includes a set of controls (e.g., buttons, dials, etc.) that enable the technician to control particular operating characteristics of the tool 48 (e.g., rotation speed of the tip, total elapsed time the tip rotates, main power on/off, etc.). In one arrangement, the switch 64 is configured as a foot pedal to enable the technician to start and stop rotation of the tip by depressing and letting up on the switch 64. For example, the technician can depress and let up on the switch 64 to start rotation of the tip, and subsequently depress and let up on the switch 64 again to stop the rotation of the tip. As another example, the technician can depress in order to rotate the tip (i.e., the switch 64 sends a signal to the controller 62 directing the controller 62 to rotate the tip when the technician depresses the switch 64), and then technician lets up on the switch 64 in order to stop rotation of the tip (i.e., the switch 64 sends a different signal to the controller 62 directing the controller 62 to no longer rotate the tip when the technician lets up on the switch 64). Further details of the handle portion 60 of the tool 48 will now be provided.

The handle portion 60 includes a housing 70, a motor 72 (e.g., a micro-motor) disposed within the housing 70 (the majority of the motor 72 is hidden from view but illustrated by the arrow 72 in FIG. 3), and a micro-abrasive tip 74 which rotates when the motor 72 is activated by the controller 62 through the cable 68. The tip 74 has a pencil-point shaped end 76 which is well-suited for removing parts of the metallic pads 24 (FIG. 1). By way of example only, the housing 70 includes a collar 78 that, when rotated in one direction 80, captures the tip 74 and holds the tip 74 for rotation by the motor 72. The collar 78, when rotated in a direction opposite the direction 80, releases the tip 74 (e.g., for replacement if the tip is used up or damaged). Further details of how the technician uses the tool 48 will now be provided with reference to FIGS. 4 and 5.

Figure 4:
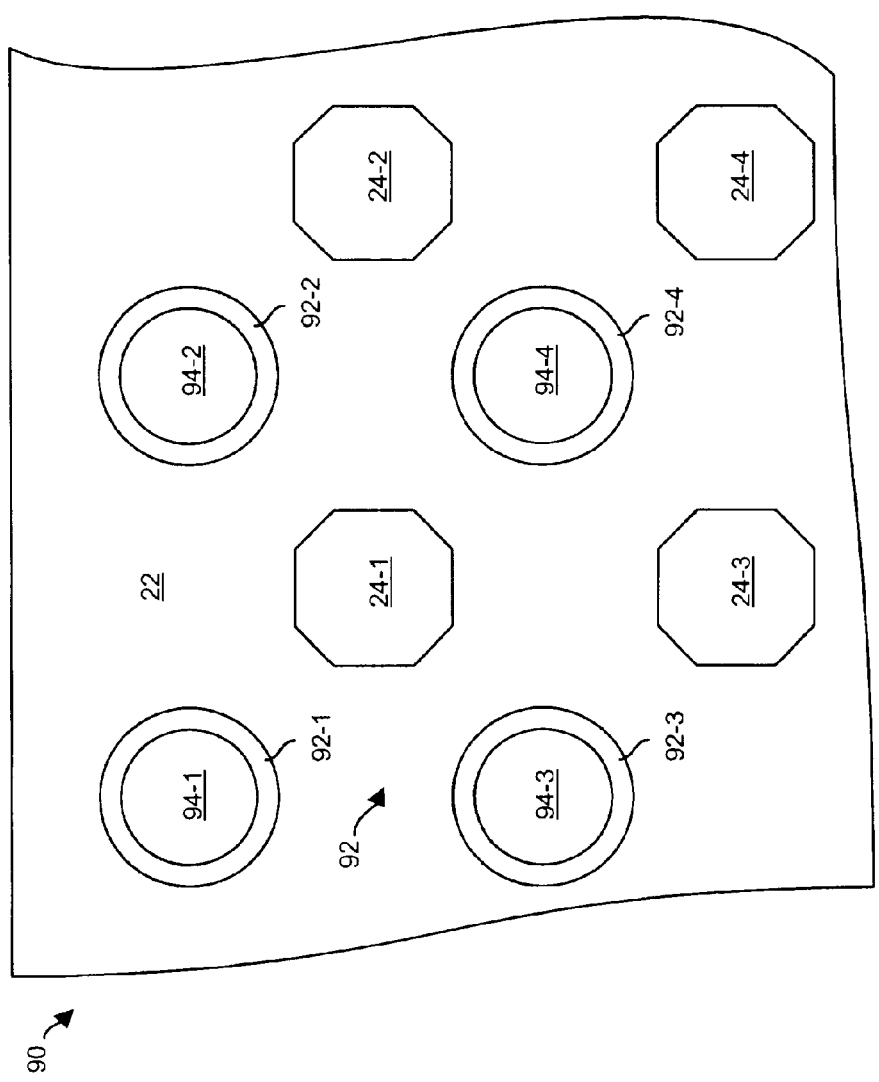
FIG. 4 is a top view of a portion of the circuit board of FIG. 1 showing circuit board features including an array of metallic pads.

FIG. 4 shows a top view 90 of part of a component mounting location 92 of the section of circuit board material 22 of FIG. 1. As shown, the component mounting location 92 includes a set of metallic pads 24-1, 24-2, . . . which are suitable for connecting to a circuit board component (e.g., a BGA component). By way of example only, each metallic pad 24-1, 24-2, . . . is adjacent to a corresponding plated-through hole 94-1, 94-2, . . . which connects that metallic pad 24-1, 24-2, . . . to another location of the circuit board section 22 (e.g., to a ground or power plane, to an internal etch that leads to another component, etc.).

On occasion, one or more of the metallic pads 24-1, 24-2, . . . can suffer from a "Black Pad" defect. A technician can discover such a defect by closely examining the pads 24 through the microscope 44 as described above. For example, the technician may determine that the pads 24-3 and 24-4 do not suffer from "Black Pad" defects, but that pads 24-1 and 24-2 suffer from "Black Pad" defects. To this end, suppose that the pad 24-1 does not include any original solder (i.e., the technician removed all of the original solder when removing the circuit board component that previously occupied the component mounting location 92) and that the top surface of the pad 24-1 includes corroded nickel. Further suppose that the pad 24-2 includes some of the original solder and corroded nickel.

In order to repair the pad 24-1, the technician removes the outer portion 36 from the top of the pads 24-1, 24-2 (also see FIG. 1) by applying carbohydroxilate flux over the pad from the carbohydroxilate flux source 50 (FIG. 2), and operating the tool 48. In particular, the technician properly dresses the tip 74 of the tool 48 by activating the motor 72 of the tool 48 to rotate the tip 74, drawing the tip 74 of the tool 48 over fine grit (e.g., 400 grit) silicone carbide material 52 and applying the tip 74 to the pad 24-1 to polish off the outer portion 36. The fine grit silicone carbide material provides the tip 74 with suitable surface characteristics for removing corroded nickel. In one arrangement, the technician sets the controller 62 of the tool 48 to rotate the tip 74 at a substantially fixed high RPM speed (e.g., substantially in the range of 2000 to 2200 RPM) for 10 seconds. The technician then maneuvers the handle portion 60 such that the tip 74 is angled substantially between 55 and 65 degrees from the pad surface 34 (FIG. 1) and applies the tip 74 to the pad 24. The technician moves the tip 74 around the top of the pad 24-1 in a orbital motion to scratch off 20 to 50 micro-inches of the nickel layer 28. The presence of the carbohydroxilate flux prevents the pad 24-1 and the tip 74 from overheating and suffering heat damage, provides proper abrasion, and contains much of the resulting debris (i.e., corroded nickel, dust from the tip 74, etc.). Without an adequate amount of carbohydroxilate flux, the tip 74 could overheat and break down leaving a slurry.

In one arrangement, the tip 74 is formed entirely of fiber-reinforced polyester material. In another arrangement, the tip 74 includes other material as well, but has a reinforced polyester material at its end 76. In another arrangement, the tip 74 does not include fiber-reinforced polyester material, but a different material having the similar properties to that of fiber-reinforced polyester material (e.g., doesn't leave a lot of debris, can be dressed with a similar tip shape, similar hardness, similar porosity, similar surface finish, similar temperature response, etc.).

In order to repair the pad 24-2 which includes some of the original solder, the technician first dresses the tip 74 of the tool 48 by drawing activating the motor 72 of the tool 48 and drawing the tip 74 over coarse grit silicone carbide material 52 (e.g., silicone carbide paper having 160 grit). The coarse grit silicone carbide material provides the tip 74 with suitable surface characteristics for removing solder. The technician then distributes carbohydroxilate flux over the pad 24-2, and applies the rotating tip 74 to the top surface 34 of the pad 24-2. The rotating tip 74 removes the solder from the pad 24-2. Again, in one arrangement, the technician sets the controller 62 of the tool 48 to rotate the tip 74 at a substantially fixed high RPM speed (e.g., substantially in the range of 2000 to 2200 RPM) for 10 seconds. The technician then maneuvers the handle portion 60 such that the tip 74 is angled substantially between 55 and 65 degrees from the pad surface 34 (FIG. 1) and applies the tip 74 to the pad 24. The technician moves the tip 74 around the top of the pad 24-2 in a orbital motion to polish off the solder. The presence of the carbohydroxilate flux prevents the pad 24-2 and the tip 74 from overheating and suffering heat damage (e.g., prevents the tip 74 from breaking down), provides proper abrasion, and contains much of the resulting debris (i.e., solder, dust from the tip 74, etc.). Further details of the invention will now be provided with reference to FIG. 5.

Figure 5:
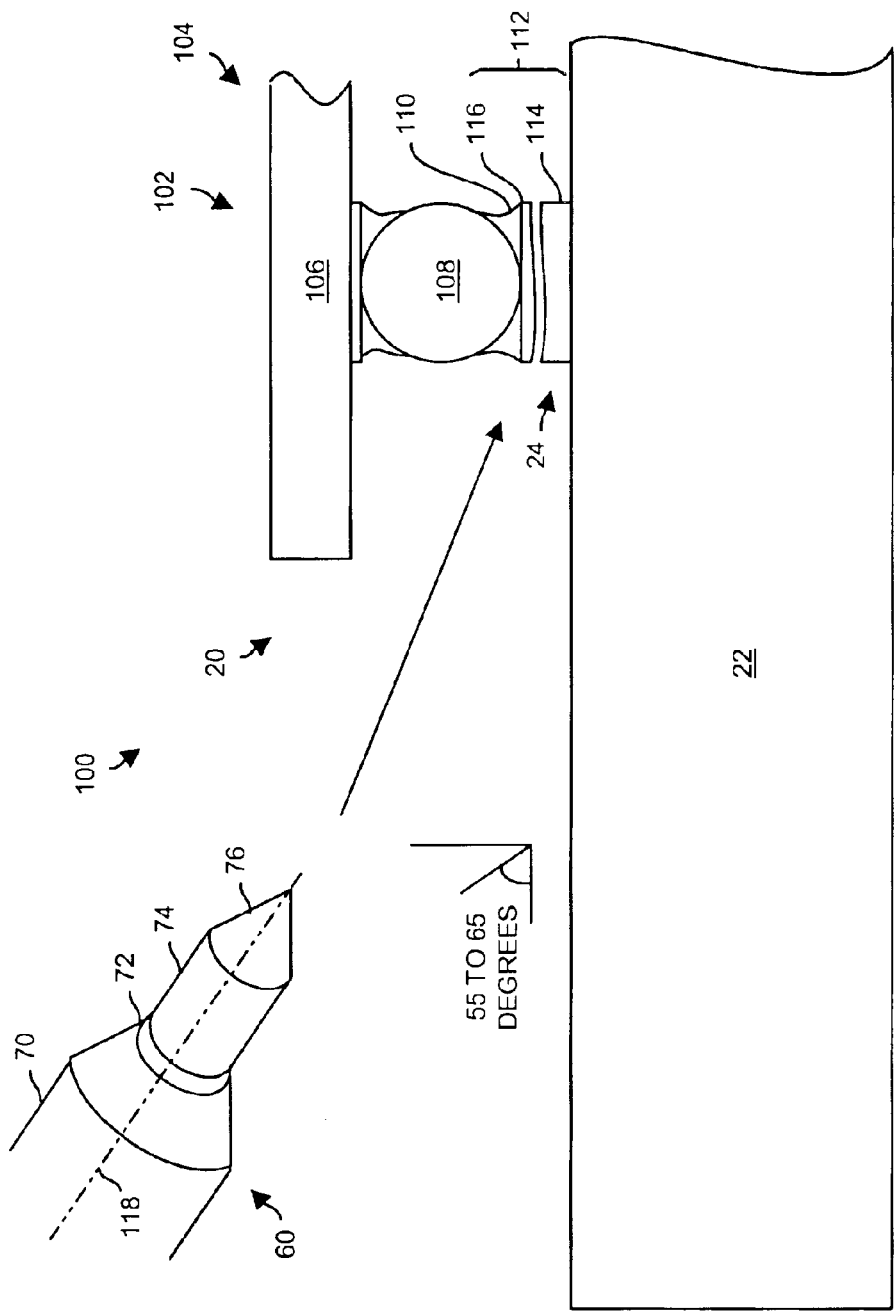
FIG. 5 is a cross-sectional view of a portion of the circuit board of FIG. 1 with a disconnection at an intermetallic bond.

FIG. 5 shows a cross-sectional view of a portion 100 of the circuit board 20. As shown, a circuit board component 102 resides over a component mounting location 104 of the circuit board 20. By way of example only, the component includes a BGA package 106 (which houses circuitry on a silicon substrate) and a set of ball contacts 108. Each ball contact 108 combines with solder 110 to form a solder joint 112 with a metallic pad 24 of the circuit board 20. Unfortunately, as shown in FIG. 5, the circuit board 20 suffers from a fracture 113 which results in a pressure sensitive discontinuity, or intermittent continuity between a portion 114 (the pad 24) and a portion 116 (the intermetallic), e.g., due to a "Black Pad" defect in the pad 24. Accordingly, the circuit board 20 does not work properly.

In order to fix the circuit board 20 in accordance with an embodiment of the invention, the technician first removes the component 102 from the component mounting location 104. The technician then applies the tip 74 of the tool 48 to the pad 24 in order to remove any remaining solder 110 and the corroded portions of the pad 24. In one arrangement, and as shown in FIG. 5, the end 76 of the tip 74 is pencil-point shaped. The tip, when oriented at an angle substantially between 55 and 65 degrees (i.e., the angle between the center axis 118 and the surface plane of the pad 24) is well-suited for removing solder and the corroded portions of nickel from the pad 24 (e.g., by first applying the end 76 dressed using the coarse silicone carbide material to remove the solder 110, and then applying the end 76 dressed using fine silicone carbide material to remove the corroded nickel). These particular operations performed by the technician will now be summarized with reference to FIG. 6.

Figure 6:
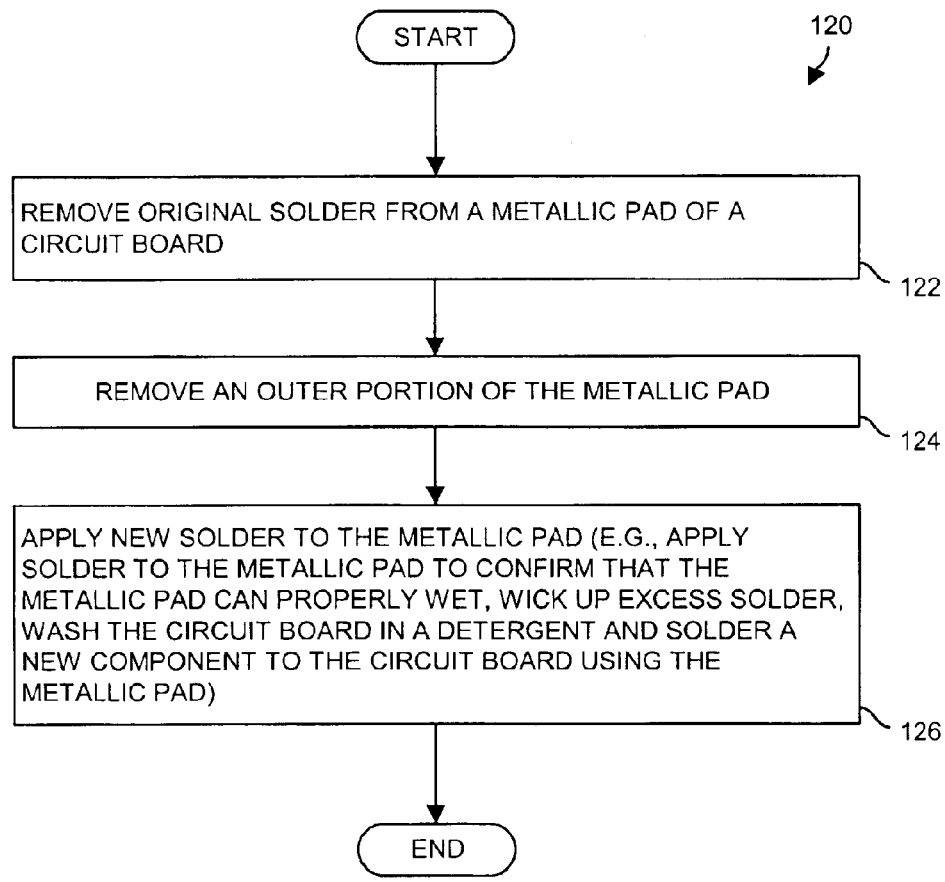
FIG. 6 is a flowchart of a procedure for reworking the circuit board of FIG. 1.

FIG. 6 shows a procedure 120 which is performed by the technician when curing a "Black Pad" defect of a metallic pad 24 of the circuit board 20. In step 122, the technician removes original solder from the metallic pad 24. This step can occur completely while the technician removes the component 102 from the component mounting location 104. Alternatively, if some solder 110 remains on the pad 24 after the component 102 is removed and the mounting location cleaned, the technician can remove the remaining solder 110 using the tool 48.

In step 124, the technician removes an outer portion of the metallic pad 24. In one arrangement, the technician removes 20 to 50 micro-inches from the top of the nickel layer 28 (see the outer portion 36 of the nickel layer 28 in FIG. 1). At this point, the remaining nickel is fresh uncontaminated nickel which has high solder-wetting ability. That is, the exposed inner portion of the pad (see the portion 38 of FIG. 1) is well-suited for establishing a new healthy electrical connection with a contact of a circuit board component.

In step 126, the technician applies new solder to the metallic pad 24. The application of such solder is a good test of the solder-wetting ability of the remaining nickel. If the solder shows signs of de-wetting or if the rate at which the solder wets to the pad 24 is relatively slow, the "Black Pad" defect of the pad has not been fully cured, i.e., some corroded nickel remains and steps 122, 124 and 126 are repeated. On the other hand, if solder shows no signs of de-wetting, it is highly likely that the "Black Pad" defect has been cured and that the pad 24 is suitable for forming a robust and healthy solder joint with a contact of a circuit board component. The new solder can be partially removed (e.g., wicked up by applying heat and contacting the solder with a de-soldering wick), but some solder will remain naturally to shield the remaining nickel (e.g., to prevent the remaining nickel from oxidizing or reacting with other contaminants).

After step 126, the metallic pad 24 is fully repaired. The pad 24 which previously was unable to wet properly, now has a high affinity for solder (e.g., when re-soldered to a new component). After any other pads 24 requiring repair are fixed in the same manner, the technician can apply flux remover to the pads 24, wipe the pads 24 with a lint-free material (e.g., a lint-free cloth), and wash the circuit board 20 in a detergent bath in order to remove any remaining residues and debris. Then, a new circuit board component (e.g., a new BGA component) can be mounted to the circuit board 20 in order to complete the repair the circuit board 20. Accordingly, the procedure 120 can be viewed as a chemo-mechanical repair process for non-wetting nickel/gold pads 24. Thus, the invention provides significant cost savings since circuit boards 20 having "Black Pad" defects are repaired, rather than thrown away. Furthermore, the added value invested in making the circuit boards 20 is preserved and not wasted even though the "Black Pad" defects may not be detected until late in the manufacturing and testing process or until after the circuit boards 20 have entered service. Further details of the invention will now be provided with reference to FIGS. 7 though 9.

Figure 7:
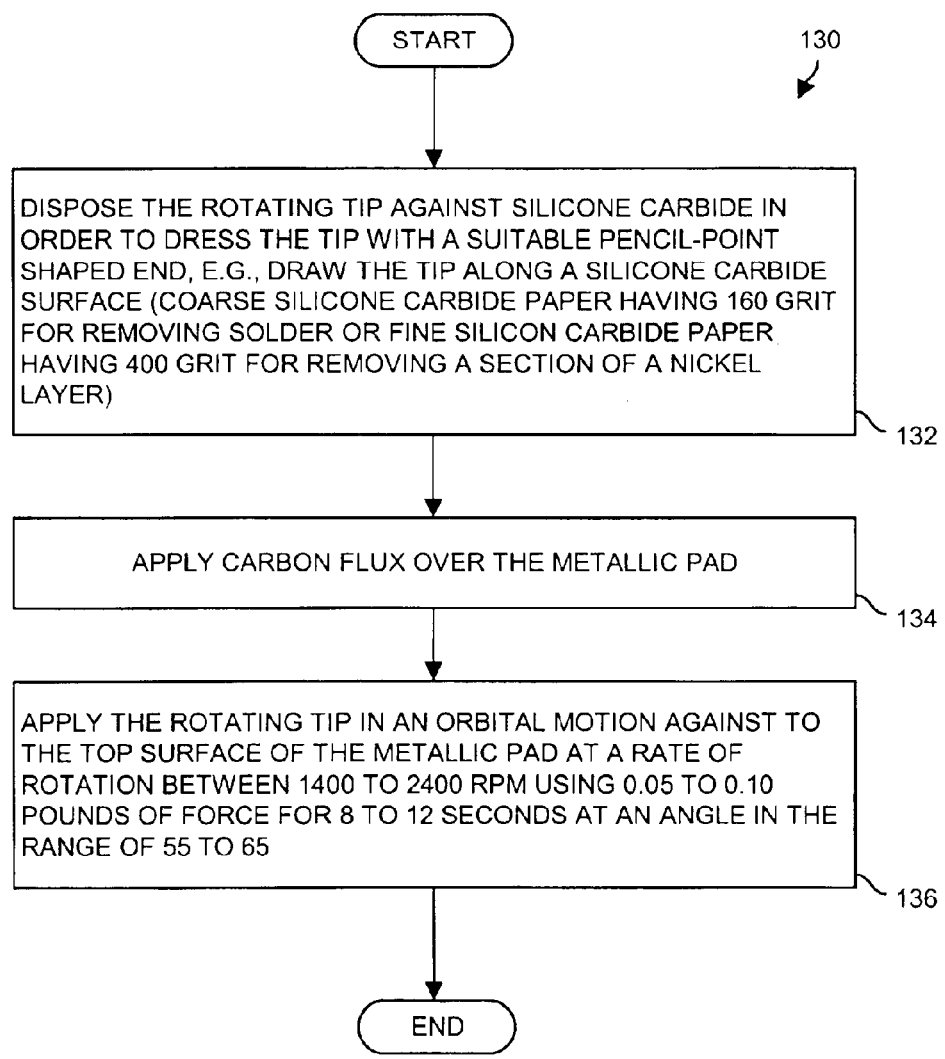
FIG. 7 is a flowchart of a procedure which is suitable for use in at least one step of the procedure of FIG. 6.
Figure 8:
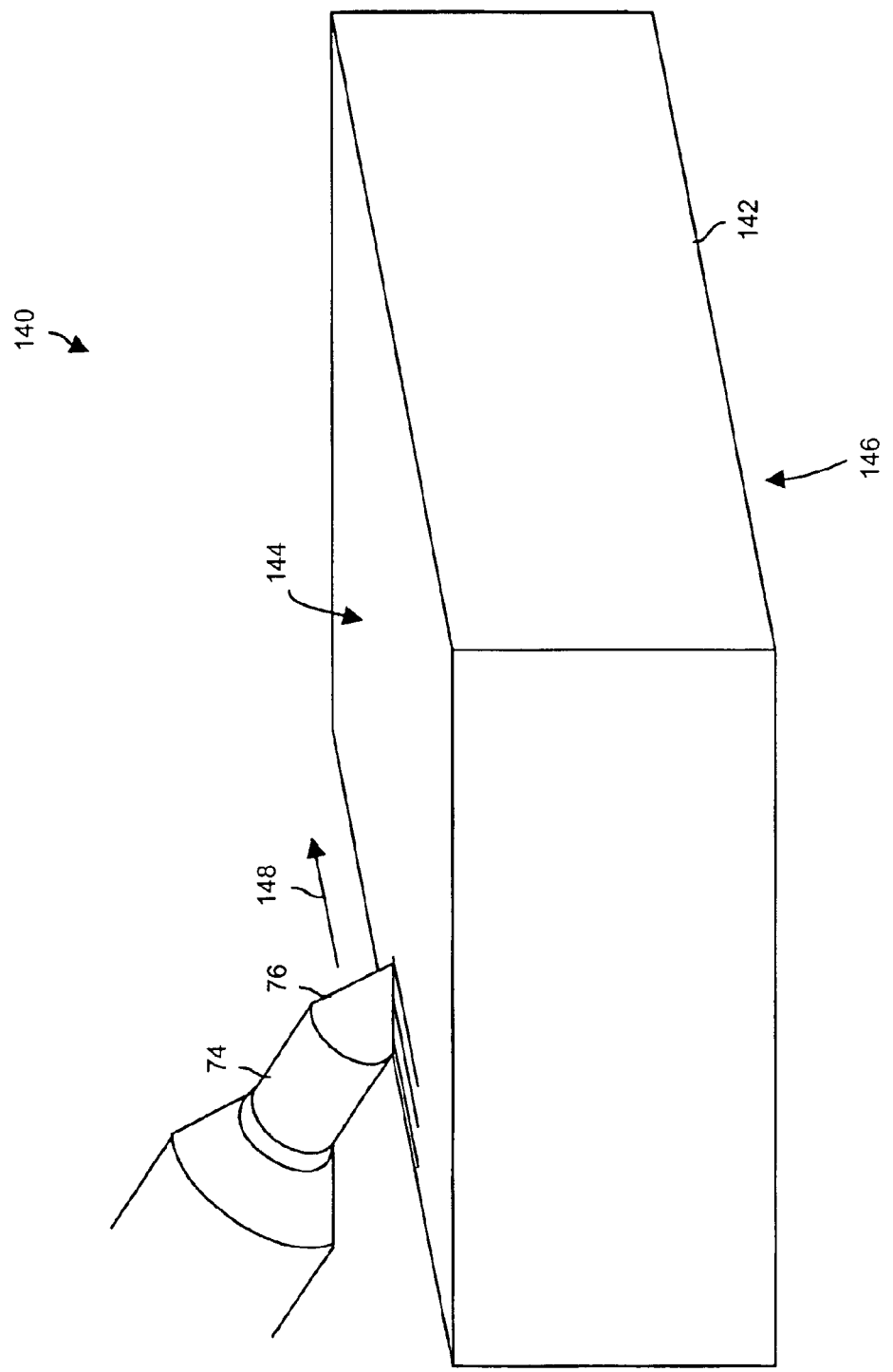
FIG. 8 is a perspective view of silicone carbide material which is suitable for use in dressing the tip of the tool of FIG. 3.

FIG. 7 shows a procedure 130 which is suitable for either of steps 122 or 124 of FIG. 6. In step 132, the technician activates the motor 72 of the tool 48 causing the tip 74 to rotate (e.g., at a rate between 2200 and 2400 RPM). The technician then disposes the rotating tip 74 against silicone carbide in order to dress the tip 74 with a suitable pencil-point shaped end 76. In one arrangement, the technician presses and draws the tip 74 along a coarse silicone carbide surface (e.g., 160 grit silicone carbide paper, etc.) when dressing the tip 74 to remove the original solder from the pad 24 (step 122 of FIG. 6), and a fine silicone carbide surface (e.g., 400 grit silicone carbide paper, etc.) when dressing the tip 74 to remove the outer portion of the nickel layer 28 (step 124 of FIG. 6). FIG. 8 shows a perspective view 140 of a silicone carbide block 142 having a coarse grit surface (e.g., 160 grit) on one side 144 and a fine grit surface (e.g., 400 grit) on another side 146. As shown in FIG. 8, the technician can properly shape and dress the tip 74 of the tool 48 by moving the tip 74 in the direction 148 along the coarse silicone carbide surface 144. The tool 48 is now ready for use on the circuit board 20.

In step 134, the technician applies carbohydroxilate flux over the metallic pad 24. As explained earlier, the carbohydroxilate flux prevents overheating of the pad 24 and the tip 74, as well as provides proper abrasion and facilitates containment of debris.

In step 136, the technician applies the rotating tip 74 in an orbital motion against the top surface 34 of the pad 24 (FIG. 1) at a rate of rotation between 1400 and 2400 RPM. In one arrangement, the rate is substantially between 2200 and 2400 RPM, the tip 74 is applied with substantially 0.05 to 0.10 pounds of force (e.g., roughly the amount of force provided by the weight of the handle portion 60 of the tool 48), for 8 to 12 seconds (e.g., 10 seconds). In situations where the weight of the handle portion 60 substantially provides the proper amount of force, a technician operating the handle portion 60 in a handheld manner can essentially guide the handle portion 60 over the pad 24 and allow the weight of the handle portion 60 to provide the proper amount of force on the pad 24.

In one arrangement, the technician orients the tip 74 of the tool 48 so that the angle of the tip 74 (i.e., a central axis of rotation of the tip 74) is approximately 60 degrees from the plane of the pad 24 (i.e., substantially between 55 and 65 degrees from the plane of the pad 24). Through experimentation, such an orientation of the tip 74 has been found to provide good results in removing material from the pad 24.

Figure 9:
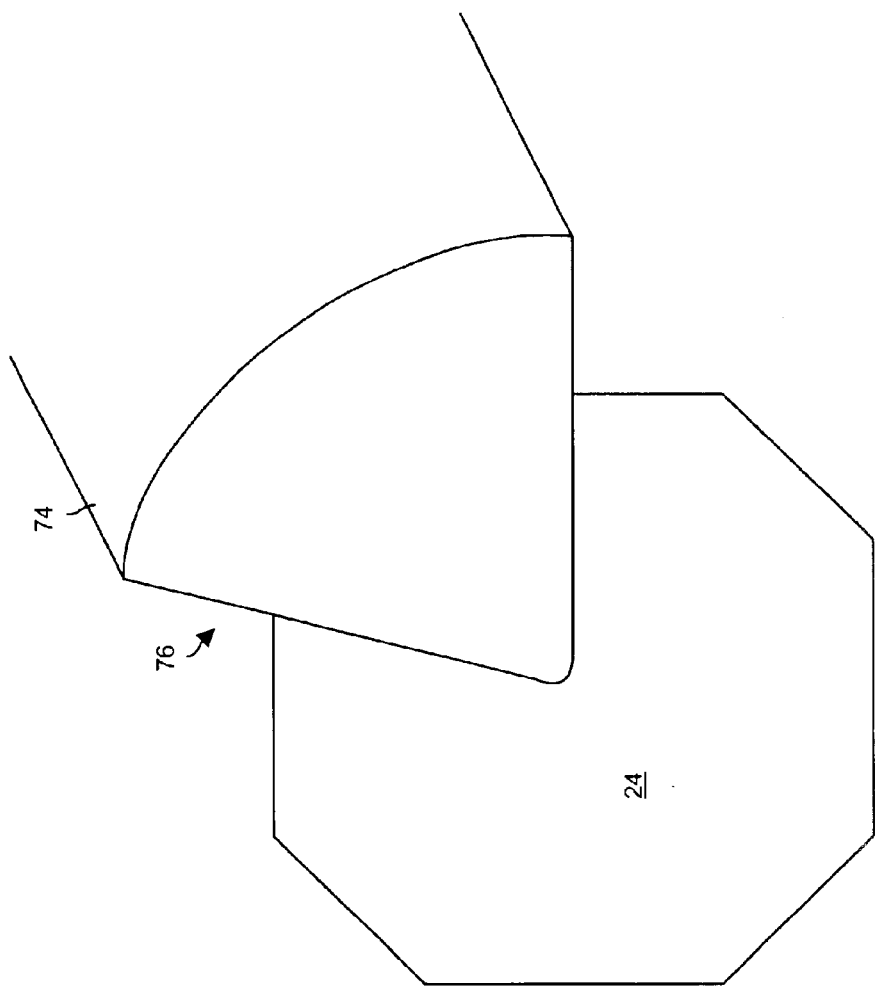
FIG. 9 is a view of a metallic pad of the circuit board of FIG. 1 when the tip of the tool of FIG. 3 is applied to the metallic pad in order to rework the circuit board of FIG. 1.

FIG. 9 shows a top close-up view of the end 76 of the tip 74 over the metallic pad 24. As shown, the tip 74 is shaped such that not more than 25% of the pad 24 is concealed by the tip 74 when the end 76 of the tip 74 is placed substantially over the center point of the pad 24, and the tip 74 is oriented substantially between 55 and 65 degrees from the plane of the pad 24. Accordingly, the technician adequately view the pad 24 as the technician removes material (i.e., solder or corroded metal) in step 136 of FIG. 7). Covering significantly more than 25% of the viewing surface of the pad 24 can hinder the technician's ability to complete the removal step consistently and reliably in 8 to 12 seconds due to the decrease in pad visibility. Additionally, if the tip 74 covers more than 25% of the viewing surface, the tip 74 may not be properly dressed with a pencil-point shaped end 76 which has been determined to be well-suited for removing material from the pad 24. Further details of the invention will now be provided with reference to FIG. 10.

Figure 10:
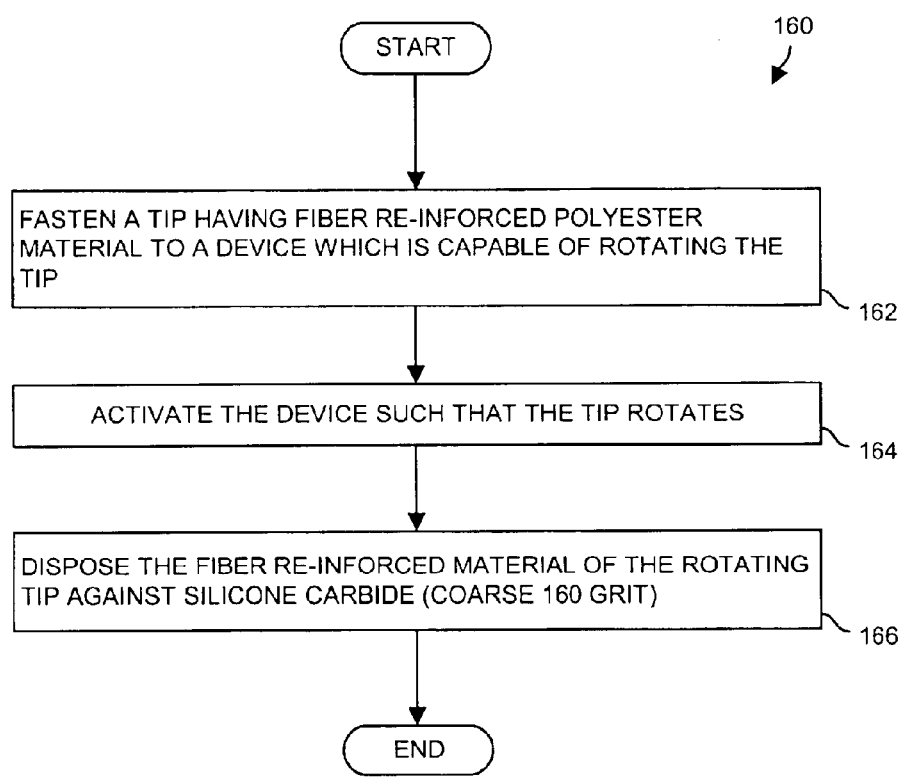
FIG. 10 is a flowchart of a procedure for making the tool of FIG. 3.

FIG. 10 is a flowchart of a procedure 160 which is performed by a technician when making the tool 48, i.e., preparing the tool 48 so that it is well-suited for removing material from a metallic pad 24 (e.g., when making the tool 48 for the first time, when replacing a damaged or used up tip 74, etc.). In step 162, the technician fastens a tip 74 having fiber-reinforced polyester material (or a suitable substitute) to a device (see the handle portion 60 of the tool 48 of FIG. 3) which is capable of rotating the tip 74. Step 162 can involve turning a collar 78 in a direction 80 (see FIG. 3) relative to the device in order to secure the tip 74 in the device.

In step 164, the technician activates the motor 72 of the device such that the tip rotates. In one arrangement, the tip 74 rotates at a rate between 1400 and 2400 RPM.

In step 166, the technician disposes the fiber-reinforced material of the rotating tip 74 against silicone carbide in order to properly shape the end 76 of the tip 74 into a pencil-point shape. Through experimentation, a coarse grit silicone carbide surface (e.g., 160 grit) is well-suited for shaping the end 76 of the tip 74. In particular, the coarse grit tends to provide the tip 74 with a well-suited porosity and surface finish for effectively removing material from the pad 24.

As described above, the invention is directed to techniques for reworking a circuit board 20 having a metallic pad 24. The techniques involve removing an outer portion 36 of the metallic pad 24 in order to expose an inner portion 38 of the metallic pad 24. These techniques are well-suited for curing "Black Pad" defects since corrosion (e.g., oxidized metal and metal reacted with other contaminants) in the outer portion 36 of the metallic pad 24 have been identified as significant causes of poor electrical connectivity in metallic pads 24 suffering from "Black Pad" defects. Accordingly, removal of the outer portion 36 of such a metallic pad 24 exposes a healthy and reliable inner portion 38 of the pad (i.e., fresh and uncontaminated metal) which is well-suited for establishing a new healthy electrical connection with a contact of a circuit board component. The features of the invention, as described above, may be employed in equipment and procedures such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the metallic pads 24 were described above as including a copper layer 26, a nickel layer 28 and a coating of gold 30 by way of example only, and that other materials are suitable for use as well in the pads 24. For instance, the pads 24 can be predominantly made of copper and coated with a noble metal other than gold. The techniques of the invention are well-suited for curing "Black Pad" defects and similar types of defects for such pads.

Additionally, it should be understood that there is no limit to the number of pads 24 of a circuit board 20 that can be repaired at a workstation site (see the block diagram of the workstation in FIG. 2). For example, a technician can perform the procedures illustrated in FIGS. 6 and 7 many times on a single circuit board 20. Though experimentation, the number of pads serviced between redressings can be determined. For instance, in one arrangement, the technician redresses the tip 74 of the tool 48 after removing solder from each pad 24. However, the technician can apply the tip 74 to up to three pads 24 to remove corroded nickel before needing to be redressed again.

Furthermore, it should be understood that the pads 24 were shown as being formed in arrays (see FIG. 4) and being octagonal in shape (see FIGS. 4 and 9) by way of example only. Other configuration are suitable for use by the invention as well. For example, the pads 24 can be arranged in single rows or columns, in staggered fashion, etc. Also, the pads 24 can be round in shape, square, hexagonal, etc.

Additionally, it should be understood that the tool 48 was described as having a sophisticated controller 62 and switch 64 by way of example only. In other arrangements, the tool is a lightweight, handheld device (e.g., a battery operated high-speed drilling device), and the technician manually tracks time and applied force. In another arrangement, the tool 48 is implemented as automated equipment (e.g., robotics) and one or more of the procedures of FIGS. 6, 7 and 10 is performed by the automated equipment rather than a technician thus alleviating the need for a technician or thus only needing technician supervision.

Furthermore, it should be understood that the techniques of the invention can be applied to structures other than metallic pads 24 of circuit boards 20. In some arrangements, the techniques are applied to other metallic structures such as pins, component contacts, connectors, etc. in order to remove corrosion and reacted metal portions and improve the electrical conductivity and/or wettability of the remaining metal.

Additionally, it should be understood that the particular parameter settings for the tool 48 (e.g., 2200 to 2400 RPM, 0.05. to 0.10 pounds of force, 8 to 12 seconds, 55 to 65 degree angle, dressing using 160 and 400 grit silicone carbide, providing an orbital motion, etc.) were provided as suitable operating parameters and by way of example only. Other operating parameters can be used as well when repairing "Black Pad" defects with electroless nickel immersion gold finishes (e.g., different RPMs, forces, amounts of time, angles, grit values, motions, etc.). Moreover, the parameters can be adjusted and tuned for other types of pads depending on the structural and chemical characteristics of those pads.

Furthermore, it should be understood that the tool 48 having the rotatable micro-abrasive tip 74 was described above as being suitable for removing material from the metallic pads 24 by way of example only. Other tools can be used as well. For example, an alternative tool can have a tip that provides a non-circular orbital rotation (e.g., an elliptical orbit or an irregular orbit). As another example, an alternative tool can provide a micro-abrasive tip having a sideways or back-and-forth movement, or having a vibration (e.g., sonic or ultrasonic vibration) rather than circular movement. As yet another example, the tool can provide a micro-abrasive tip having a belt-like movement (e.g., similar to a belt sander) rather than circular movement. Such modifications and enhancements are intended to be covered by the invention.

What is claimed is:

1. A method for reworking a circuit board having a metallic pad, the method comprising the steps of:

removing original solder from the metallic pad;

removing an outer portion of the metallic pad to expose an inner portion of the metallic pad; and applying new solder to the metallic pad;

wherein the metallic pad includes a layer of nickel, wherein the step of removing the outer portion of the metallic pad includes the step of:

taking off a section of the layer of nickel which is substantially in the range of 20 to 50 micro-inches in thickness;

wherein a tool has a tip which is capable of rotating, wherein the step of taking off the section of the layer of nickel includes the steps of:

positioning the circuit board onto a workstation base, and applying the tip of the tool to the layer of nickel while the circuit board is disposed on the workstation base and while the tip of the tool rotates; and wherein the method further comprises the step of:

prior to the step of taking off the section of the layer of nickel, disposing the tip of the tool against silicone carbide material in order to dress the tip of the tool for removal of the section of the layer of nickel.

2. The method of claim 1 wherein the tip of the tool includes fiber-reinforced polyester material, and wherein the step of applying the tip of the tool includes the step of:

contacting the layer of nickel with the fiber-reinforced polyester material of the tip with an amount of force substantially in the range of 0.05 to 0.10 pounds of force.

3. The method of claim 1 wherein the step of applying the tip of the tool includes the step of:

contacting the layer of nickel with the tip of the tool for an amount of time substantially in the range of 8 to 12 seconds while the tip of the tool rotates at a rate substantially in the range of 1400 to 2400 rotations per minute.

4. The method of claim 1 wherein the tip of the tool has a pencil-point shaped end, and wherein the step of applying the tip of the tool includes the step of:

orienting the pencil-point shaped end of the tip to the layer of nickel at an angle which is substantially in the range of 55 to 65 degrees.

5. The method of claim 1 wherein the step of disposing the tip of the tool against the silicone carbide material includes the step of:

drawing the tip along a silicone carbide surface having a grit value of substantially 400 grit.

6. The method of claim 1, further comprising the step of:

prior to the step of removing the original solder from the metallic pad, drawing the tip of the tool along a silicone carbide surface having a grit value of substantially 160 grit in order to dress the rotating the tip of the tool for removal of the original solder from the metallic pad.

7. The method of claim 1, further comprising the step of:

prior to the step of removing the outer portion of the metallic pad, distributing carbohydroxilate flux over the metallic pad.

8. The method of claim 1, further comprising the step of:

prior to the step of removing the original solder from the metallic pad, distributing carbohydroxilate flux over the metallic pad.

9. The method of claim 1, further comprising the step of:

removing an excess of the new solder from the metallic pad;

after the step of removing the excess solder, applying flux remover to the metallic pad;

after the step of applying the flux remover, wiping the metallic pad with a lint-free cloth; and after the step of wiping the metallic pad, washing the circuit board in a detergent bath.

10. The method of claim 9 wherein the metallic pad resides in a component mounting location of the circuit board, and wherein the method further comprises the steps of:

prior to the step of removing the original solder from the metallic pad, unsoldering an original Ball Grid Array component from the component mounting location such that a ball of the original Ball Grid Array component disconnects from the metallic pad; and after the step of washing the circuit board, soldering a new Ball Grid Array component to the mounting location such that a ball of the new Ball Grid Array component connects to the metallic pad.

11. The method of claim 1 wherein the metallic pad is substantially plane-shaped structure, and wherein the step of removing the outer portion of the metallic pad includes the step of:

taking off, from the plane-shaped structure, a layer which is substantially coplanar with an outer surface of the circuit board.

12. The method of claim 11 wherein the plane-shaped structure is configured to mount to a surface mount technology contact, and wherein the step of taking off the layer includes the step of:

removing outer pad material to expose virgin inner pad material to form a new solder joint with a new surface mount technology contact.

13. A method for reworking a circuit board having a metallic pad, the method comprising the steps of:

removing original solder from the metallic pad;

removing an outer portion of the metallic pad to expose an inner portion of the metallic pad; and applying new solder to the metallic pad;

wherein the metallic pad includes a layer of nickel;

wherein the step of removing the outer portion of the metallic pad includes the step of:

taking off a section of the layer of nickel which is substantially in the range of 20 to 50 micro-inches in thickness;

wherein a tool has a tip which is capable of rotating, wherein the step of taking off the section of the layer of nickel includes the steps of:

positioning the circuit board onto a workstation base, and applying the tip of the tool to the layer of nickel while the circuit board is disposed on the workstation base and while the tip of the tool rotates; and wherein the step of applying the tip of the tool includes the step of:

observing a top surface of the metallic pad through a microscope;

positioning the tip over the metallic pad such that, when an end of the tip of the tool resides substantially over a center point of the top surface of the metallic pad, at least 75% of the top surface of the metallic pad is visible through the microscope; and while continuing to observe the metallic pad through the microscope, moving the tip of the tool over the metallic pad with an orbital motion stroke to take off the section of the layer of nickel.

* * * * *